United States Patent [19]
Ali et al.

[11] Patent Number: 5,494,774
[45] Date of Patent: Feb. 27, 1996

[54] THERMAL TRANSFER DONOR AND RECEPTOR FOR LITHOGRAPHIC PRINTING APPLICATIONS

[75] Inventors: M. Zaki Ali; Mahfuza B. Ali, both of Mendota Heights; David R. Boston, Woodbury; Jeffrey C. Chang, Ramsey, all of Minn.

[73] Assignee: Minnesota Mining and Manufacturing Company, Saint Paul, Minn.

[21] Appl. No.: 419,046

[22] Filed: Apr. 10, 1995

Related U.S. Application Data

[62] Division of Ser. No. 320,943, Oct. 11, 1994.

[51] Int. Cl.$^6$ .............................. G03C 8/08; G03C 8/26; G03C 1/93
[52] U.S. Cl. .......................... 430/200; 430/202; 430/204; 430/272.1; 430/287.1
[58] Field of Search ...................................... 430/200, 202, 430/204, 272, 254, 287; 101/453, 455

[56] References Cited

U.S. PATENT DOCUMENTS

| | | | |
|---|---|---|---|
| 3,971,660 | 7/1976 | Staehle | 430/204 |
| 5,204,219 | 4/1993 | Ooiji et al. | 430/272 |
| 5,235,015 | 8/1993 | Ali et al. | 430/281 |

*Primary Examiner*—Richard L. Schilling
*Attorney, Agent, or Firm*—Gary L. Griswold; Walter N. Kirn; Arlene K. Musser

[57] ABSTRACT

A thermal transfer system for transferring material in an imagewise manner by means of thermal transfer printing from a donor element to an image receiving element is used to prepare printing plates. In one construction, a donor element, which is prepared by coating a photoinitiator (and optionally a sensitizer) in a binder on a backing material, is used with an image receiving element, which is prepared by coating a photopolymer (and optionally a sensitizer) on a substrate having a microporous hydrophilic crosslinked silicated surface. In an alternative construction, a donor element, which is prepared by coating a sensitizer in a binder on a backing material, is used with an image receiving element, which is prepared by coating a photopolymer and photoinitiator on a substrate having a microporous hydrophilic crosslinked silicated surface. In yet another construction, a donor element, prepared by coating a thermal transfer layer containing a photopolymer, a photoinitiator and/or a sensitizer on a backing material, is used with an image receiving element having a microporous hydrophilic crosslinked silicated surface.

16 Claims, No Drawings

THERMAL TRANSFER DONOR AND RECEPTOR FOR LITHOGRAPHIC PRINTING APPLICATIONS

This is a division of application No. 08/320,943 filed Oct. 11, 1994, now allowed.

FIELD OF THE INVENTION

The present invention relates to the manufacture of digital lithographic printing plates. In particular, the invention relates to the use of thermal mass and/or dye transfer mechanisms from donor to receptor films or plates in the manufacture of lithographic printing plates.

BACKGROUND OF THE INVENTION

Thermal transfer imaging systems have been used in recent years to make high quality color hard copy from electronic data. These systems basically utilize a recording method in which a donor sheet, having a colorant (i.e., dye or pigment) layer thereon, and a receptor sheet are brought into contact and the donor sheet is heated with a thermal printhead or a laser heat source, for example. By selectively heating and transferring an image forming material from the donor sheet, a desired image is formed on the receptor sheet. This imaging process can involve either mass transfer or dye transfer.

In thermal mass transfer systems, the image is formed by the transfer of a mass of material containing colorant therein, such as pigment-filled polymer coatings, from the donor sheet to the receptor sheet. In thermal dye transfer systems, the image is formed by the transfer of a colorant (the dye) from the donor sheet to the receptor sheet in a controlled fashion (e.g., by sublimation, melt transfer, or diffusion).

A lithographic printing plate comprises a substrate, a hydrophilic surface on the substrate, and a hydrophobic layer disposed in imagewise fashion on the hydrophilic surface. In a traditional printing plate, a hydrophobic photopolymer layer is pre-coated over the entire hydrophilic surface of the substrate. The photopolymer layer is contacted with a mask, exposed, and developed with a liquid developer to remove a portion of the photopolymer layer and form the desired image. The whole process for making such a conventional printing plate is very expensive because it requires masking and it is labor-intensive. Also, it is messy because of the use of liquids, and environmentally unsafe if high pH or organic solvent-based developers are used.

In the past, people have tried with limited success to develop totally dry direct printing plate systems that could solve the above problems. One more economical approach has been to prepare printing plates using thermal mass transfer processes. Thermoplastic resins have generally been used as hydrophobic materials in such thermal mass transfer processes. Uncrosslinked thermoplastic resins are not very resistant to heat or abrasion, however, and printing plates made of this type of resin suffer from short press life due to this poor abrasion resistance. The laser induced ablative transfer of thermally crosslinkable materials to produce a printing plate was disclosed in U.S. Pat. No. 3,964,389. This system reportedly resulted in a printing plate with improved press life. However, this system requires thermal post-curing, which takes considerably more time than a photopolymerizable system.

SUMMARY OF THE INVENTION

This invention provides a receptor sheet comprising a polymeric film bearing a microporous hydrophilic crosslinked silicated surface for use in making digital lithographic printing plates by means of thermal mass or dye transfer imaging mechanisms from a donor sheet. More specifically, this invention provides: (1) a donor element comprising a backing material having on at least one major surface thereof a thermal transfer layer comprising a photoactivator (i.e., a photoinitiator, sensitizer, or combination thereof); and (2) an image receiving element comprising a substrate having a microporous hydrophilic crosslinked silicated surface. The image receiving element can become the base for a lithographic printing plate.

For a thermal mass transfer system, a mild (i.e., pH about 7–10) alkali soluble photopolymer is initially disposed in the thermal transfer layer on the donor element. Upon imaging, the thermal transfer layer (i.e., photoinitiator, mild alkali soluble photopolymer, and other optional materials) is transferred in an imagewise manner to the microporous hydrophilic crosslinked silicated surface of the image receiving element. Thus, in the mass transfer process, a hydrophobic image is transferred from a donor sheet to a printing plate base under heat and pressure. For a thermal "dye" transfer system, the mild alkali soluble photopolymer is coated on the microporous hydrophilic crosslinked silicated surface of the image receiving element. Upon imaging, the thermal transfer layer, i.e., photoactivator (photoinitiator and/or sensitizer) and any optional materials, is transferred in an imagewise manner to the image receiving element. Although this latter system is referred to as a thermal "dye" transfer system, it is not a conventional dye transfer system in which a dye or other colorant is transferred to the image receiving element. Rather, this term is used merely as a reference to the mechanism (i.e., diffusion, melting, or sublimation of an active photoactivator without substantial binder transfer) that is involved in the transfer of the photoactivator (photoinitiator and/or sensitizer) and optional materials. That is, although a dye is not necessarily transferred, the photoactivator is transferred in a similar manner as a dye is transferred in a thermal dye transfer system. Thus, this "dye" transfer system is more appropriately referred to as a thermal photoinitiator transfer system or as a thermal sensitizer transfer system, for example. In this process, the photoinitiator and/or sensitizer is transferred in an imagewise manner from a donor sheet to a lithographic base plate under heat and pressure.

The mild alkali soluble photopolymer, i.e., photocurable polymer, is preferably a thermoplastic crosslinkable photopolymer that is stable and thermally transferable. More preferably, it has a linear, predominantly or entirely hydrocarbyl, backbone and pendant peptide groups with free-radically polymerizable functionality attached thereto, and additionally, at least one organic oxyacid group or salt thereof. Most preferably, the photopolymer is based on multifunctional VDM (2-vinyl-4,4-dimethyl-2-oxazoline-5-one) and can be represented by the following general formula:

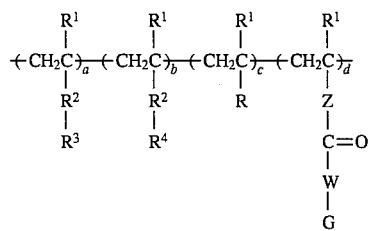

wherein:

$R^1$ independently is hydrogen or methyl;

$R^2$ is represented by

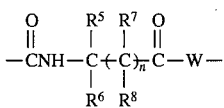

wherein:

n is 0 or 1; and $R^5$, $R^6$, $R^7$, and $R^8$ are each independently an alkyl group having 1 to 12 carbon atoms or a cycloalkyl group having 5 to 12 carbon atoms, an aryl or aralkyl group having 6 to 12 carbon atoms, or at least one of the pairs $R^5$ and $R^6$, or $R^7$ and $R^8$, taken together with the carbon to which it is joined forms a 5- or 6-membered carbocyclic ring, or any of $R^5$, $R^6$, $R^7$, and $R^8$ may be H; W is —NH—, —$NR^{20}$—, —S—, or —O—, wherein $R^{20}$ is an alkyl group having 1 to 12 carbon atoms; and Z is represented by

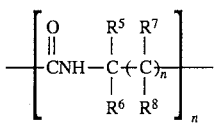

wherein: $R^5$, $R^6$, $R^7$, $R^8$, and n are as previously described;

$R^3$ is a polymerizable, ethylenically unsaturated group selected from

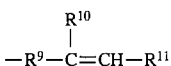

wherein:

$R^9$ is an alkylene group having 1 to 12 carbon atoms, an arylene group having 6 to 10 carbon atoms, an oxyalkylene group or a poly(oxyalkylene) in which said alkylene group has 2 to 4 carbon atoms and the number of oxygen atoms is a positive integer less than or equal to four;

$R^{10}$ is hydrogen, cyano, a carboxyl group, or a —C(=O)$NH_2$ group; and $R^{11}$ is hydrogen, an alkyl group having 1 to 12 carbon atoms, or a phenyl group or naphthyl group; or (ii) —$R^9$—W—T;

wherein:

$R^9$ is as defined in (i);

W is as previously defined; and

T is an ethylenically unsaturated group selected from the group consisting of allyl, vinyl, acryloyl, methacryloyl, cinnamoyl, maleoyl, fumaroyl, itaconoyl, and crotonoyl, and is preferably acryloyl or methacryloyl;

a, b, c, and d are independently integers, wherein a and b are at least 1, and the sum of a+b+c+d is sufficient to provide a polymer having a number average molecular weight in the range of 2,000 to 2,000,000 Daltons;

G is represented by —$R^9$—$N^+R^{12}R^{13}R^{14}$ $X^-$;

wherein:

$R^9$ is as previously defined; and $R^{12}$–$R^{14}$ are each independently an alkyl group having 1 to 24 carbon atoms or a cycloalkyl group having 5 to 12 carbon atoms, an aryl or aralkyl group having 6 to 12 carbon atoms, or any two or all three of $R^{12}$–$R^{14}$ taken together with the nitrogen to which they are joined form a 5- to 8-membered heterocyclic ring; and $X^-$ represents any non-interfering anion including internal anions located elsewhere on the polymeric backbone or side chains;

R represents an aryl group having 6 to 30 carbon atoms, cyano, —$CO_2H$, carboalkoxy group having 2 to 40 carbon atoms, or a mono- or dialkylcarbamoyl group having 2 to 40 carbon atoms; and $R^4$ represents hydrogen, a solubilizing cation, or —E—A;

wherein:

E represents an organic divalent connecting group having up to a total of about 18 C, N, S, and nonperoxidic O atoms; and A is an organic or inorganic acid or salt thereof.

This photopolymer, after imaging (whether in a thermal mass transfer or thermal "dye" transfer system), is preferably crosslinked to form a durable thermosetting material on the microporous hydrophilic crosslinked silicated surface of the image receiving element.

The microporous hydrophilic crosslinked silicated surface of the image receiving element adheres strongly to a substrate, made of a polymeric film, such as polyethylene terephthalate (PET), or a metallic plate, such as aluminum or even steel. The use of silica particles forms an excellent priming layer on the substrate to improve adhesion of the photopolymer. This type of silicated surface has excellent water wettability and durability. Thus, it is very useful as a base for printing plates.

The combination of using the photocurable polymer and the wettable and durable silicated base overcomes some shortcomings of prior an printing plates, particularly those printing plate systems prepared by thermal transfer processes, plates of which are not very resistant to abrasion. Thus, the present invention provides a thermal mass transfer system and process and a thermal "dye" transfer system and process that offer dry processes for the preparation of printing plates.

DETAILED DESCRIPTION OF THE INVENTION

In one embodiment, the invention relates to a thermal mass transfer material and a receptor capable of making lithographic printing plates. The donor consists of a photopolymer which can be imagewise transferred to silicated receptor, preferably a silicated polymeric sheet, by a thermal transfer printer with conventional printhead, or a laser scanner using, for example, a diode laser or YAG laser. The photopolymer, after transfer to the receptor, i.e., image receiving element or lithographic printing plate base, can be crosslinked by exposure to radiation, preferably UV radiation. No further development steps are required to make a lithographic plate. The donor can also include a photoinitiator, sensitizer, colorant, coating aids, e.g., surfactants, as well as a thermoplastic binder. Any combination of these ingredients can be combined with the photopolymer to form a thermal transfer layer on the mass transfer donor. The receptor in a thermal mass transfer system is generally just the silicated substrate, e.g., a silicated polymeric sheet.

In another embodiment, the invention relates to a thermal photoinitiator transfer material and a receptor capable of making lithographic printing plates. The donor consists of a photoinitiator and optionally a sensitizer in a resinous binder. The photoinitiator and optional sensitizer can be imagewise transferred to a printing plate containing a silicated substrate coated with a photopolymer by using a thermal dye transfer printer with a conventional printhead, or a laser scanner using, for example, a diode laser or YAG laser. The photopolymer on the printing plate acts as a receptor for the photoinitiator and optional sensitizer, which are transferred in an imagewise manner. After thermal imaging, the photopolymer is preferably crosslinked and then developed to wash away the noncrosslinked photopolymer, i.e., the polymer outside the imaged areas. The sensitizer can be combined with the photopolymer on the receptor rather than on the donor if desired. Furthermore, the photopolymer layer can also include other colorants if desired.

In an alternative embodiment, the invention relates to a thermal sensitizer transfer material and a receptor capable of making lithographic printing plates. The donor consists of a sensitizer in a resinous binder. The sensitizer can be imagewise transferred to the receptor containing a layer of the photopolymer and the photoinitiator by using a thermal dye transfer printer with a conventional printhead, or a laser scanner using, for example, a diode laser or YAG laser. The photopolymer and photoinitiator on the printing plate acts as a receptor for the sensitizer. After thermal imaging, the photopolymer is preferably crosslinked and then developed to wash away the noncrosslinked photopolymer.

The binders used in the present invention should have some compatibility with the components mixed therewith, e.g., the photopolymer, photoinitiator, photosensitizer, and the like. This does not mean that there needs to be complete compatibility, i.e., solubility or miscibility; rather, it means that the components should be at least partially soluble or dispersible in the binder.

When the above thermal transfer process is induced by a laser scanner such as a diode laser or YAG laser, the donor construction usually includes a light absorber (e.g., infrared absorber) either in the donor layer or in an interlayer under the donor layer. This is discussed in further detail below.

Photopolymer

Suitable photopolymers for use in the present invention are thermoplastic crosslinkable photopolymers. They have a glass transition temperature, i.e., Tg, of about 20°–140° C., preferably about 20°–80° C. More preferably, they are energy sensitive polymers having a linear, predominantly or entirely hydrocarbyl, backbone and pendant peptide groups with free-radically polymerizable functionality attached thereto, and additionally, at least one organic oxyacid group or salt thereof. These functionalities i.e., carboxyl groups, lower alkyl groups (i.e., having 1–4 carbon atoms), carbonyl groups, impart aqueous solubility in mild alkaline solution (pH about 7–10), and polymerizability. The photopolymers are described in U.S. Pat. No. 5,235,015 and Applicants Assignee's copending applications U.S. Ser. No. 07/931,070 filed Aug. 17, 1992, and U.S. Ser. No. 052,337 filed Apr. 23, 1993, and such description is incorporated herein by reference.

The particularly preferred energy sensitive polymers of the instant invention, which may be block or random, preferably random, and which have homo- or copolymeric backbones, can be represented by the formula:

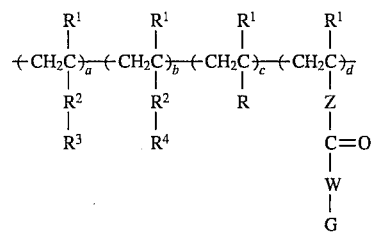

wherein:

$R^1$ independently is hydrogen or methyl;

$R^2$ is represented by

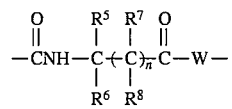

wherein:

n is 0 or 1;

$R^5$, $R^6$, $R^7$, and $R^8$ are each independently an alkyl group having 1 to 12 carbon atoms or a cycloalkyl group having 5 to 12 carbon atoms, an aryl or aralkyl group ("aralkyl group" is used herein to refer to groups containing both aromatic and aliphatic moieties) having 6 to 12 carbon atoms, or at least one of the pairs $R^5$ and $R^6$, or $R^7$ and $R^8$, taken together with the carbon to which it is joined forms a 5- or 6-membered carbocyclic ring, or any of $R^5$, $R^6$, $R^7$, and $R^8$ may be H (preferably $R^5$ and $R^6$ are methyl when n is 0);

W is —NH—, —NR$^{20}$—, —S—, or —O—; wherein $R^{20}$ is an alkyl group having 1 to 12 carbon atoms (preferably W is —O— or —NH—, and more preferably W is —O—); and Z is represented by

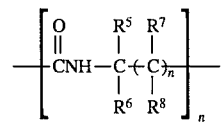

wherein $R^5$, $R^6$, $R^7$, $R^8$, and n are as previously described;

$R^3$ is a polymerizable, ethylenically unsaturated group selected from

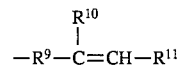

wherein:

$R^9$ is an alkylene group having 1 to 12 carbon atoms, an arylene group having 6 to 10 carbon atoms, an oxyalkylene group or a poly(oxyalkylene) in which the alkylene group has 2 to 4 carbon atoms and the number of oxygen atoms is a positive integer less than or equal to four (preferably $R^9$ is an alkylene group having 1 to 4 carbon atoms);

$R^{10}$ is hydrogen, cyano, a carboxyl group, or a —C(=O)NH$_2$ group; and $R^{11}$ is hydrogen, an alkyl group having 1 to 12 carbon atoms, or a phenyl group or naphthyl group (optionally having substitution thereon which can be, for example, halogen, an alkyl or alkoxy group having 1 to 4 carbon atoms); or (b) —$R^9$—W—T;

wherein:

$R^9$ is as defined in (a);

W is as previously defined; and

T is an ethylenically unsaturated group selected from the group consisting of allyl, vinyl, acryloyl, methacryloyl, cinnamoyl, maleoyl, fumaroyl, itaconoyl, and crotonoyl (preferably T is acryloyl or methacryloyl);

a, b, c, and d are independently integers, wherein a and b are at least 1, and the sum of a+b+c+d is sufficient to provide a polymer having a number average molecular weight in the range of 2,000 to 2,000,000 Daltons (preferably 20,000 to 1,000,000 Daltons);

G is represented by —$R^9$—$N^+R^{12}R^{13}R^{14}X^-$;

wherein:

$R^9$ is as previously defined;

$R^{12}$, $R^{13}$, and $R^{14}$ are each independently an alkyl group having 1 to 24 carbon atoms or a cycloalkyl group having 5 to 12 carbon atoms, an aryl or aralkyl group having 6 to 12 carbon atoms, or any two or all three of $R^{12}$, $R^{13}$, and $R^{14}$ taken together with the nitrogen to which they are joined form a 5- to 8-membered heterocyclic ring; and $X^-$ represents any non-interfering anion including internal anions located elsewhere on the polymeric backbone or side chains (examples of non-interfering anions are well known in the imaging art and include, but are not limited to, anions with a unitary negative charge such as chloride, bromide, iodide, alkyl and aryl carboxylates, alkyl and aryl sulfonates, bicarbonate, etc., and anions with a negative charge greater than 1 such as sulfate, phosphate, and the like (preferred anions are iodide, chloride, and bromide));

R represents an aryl group having 6 to 30 carbon atoms, cyano, —$CO_2H$, carboalkoxy group having 2 to 40 carbon atoms, or a mono- or dialkylcarbamoyl group having 2 to 40 carbon atoms (preferably R is —$CO^2H$); and $R^4$ represents hydrogen, a solubilizing cation (such as sodium, potassium, or quaternary ammonium), or —E—A;

wherein:

E represents an organic divalent connecting group having up to a total of about 18 C, N, S, and nonperoxidic O atoms; and A is an inorganic or organic acid or salt thereof.

The $R^4$ group may be multifunctional, having more than one group A. Non-limiting examples of E include alkylene and arylene groups (e.g., propane-1,3-diyl, methylene, dodecane-1,12-diyl, p-phenylene), oxa-substituted alkylene groups (e.g., 2-oxapropan-1,3-diyl, 3-oxapentan-1,5-diyl), aza-substituted alkylene groups (e.g., 2-azapropan-1,3-diyl, 3-methyl-3-azapentan-1,5-diyl), and the like. Examples of A include, but are not limited to, carboxylic acids (—COOH functionality), phosphonic acids (—$PO_3H_2$ functionality), sulfonic acids (—$SO_3H$ functionality), and their salts with alkali metals (e.g., sodium, lithium, potassium), or mono-, di-, tri-, and tetra-substituted ammonium salts (e.g., ammonium, tetrabutyl ammonium, phenyldipropylammonium). Preferably, A is a carboxylic acid, sulfonic acid, phosphonic acid, or an alkali metal or tetra-substituted ammonium salt thereof.

The preferred photopolymers of the invention are conveniently prepared by free-radically polymerizing an alkenyl azlactone monomer, optionally in the presence of additional free-radically polymerizable comonomers, to give a polymer which is subsequently derivatized with functional free-radically polymerizable groups. It is preferred to use 10 to 100 weight percent alkenyl azlactone monomer and 0 to 90 weight percent comonomer, more preferably 50 to 100 weight percent alkenyl azlactone and 50 to 0 weight percent comonomer. This procedure avoids the problem of polymerization of the pendant free-radically polymerizable group during synthesis of the polymer backbone.

2-Alkenylazlactones are well-known and many are commercially available. Their synthesis, physical and chemical properties, homo- and copolymerization behavior, and preparation, are discussed in a review by Rasmussen et al., "Polyazlactones" in *Encyclopedia of Polymer Science and Engineering*, 2nd ed.; 1988; Vol. 11, pp. 558–571. Useful 2-alkenylazlactones for use in the present invention include 2-vinyl-4,4-dimethyl-2-oxazolin-5-one, 2-isopropenyl-4,4-dimethyl-2-oxazolin-5-one, 2-vinyl-4-ethyl-4-methyl-2-oxazolin-5-one, 2-vinyl-4,4-diethyl-2-oxazol-5-one, 2-vinyl-4-methyl-4-phenyl-2-oxazolin-5-one, 2-isopropenyl-4,4-tetramethylene-2-oxazolin-5-one, 2-vinyl-4,4-pentamethylene-2-oxazolin-5-one, and 2-vinyl-4,4-dimethyl-2-oxazin-6-one.

Polymerization of the monomers to provide a homopolymer or a copolymer may be accomplished by either thermal (for example through the decomposition or acyl peroxides, dialky percarbonates, azoalkanes, etc.) or photochemical (such as photolysis of bisimidazoles, benzoin ethers, aromatic ketones, or halomethyl-s-triazines) means well known in the art.

The polymerized 2-alkenylazlactone is then nucleophilically substituted to give an aqueous soluble photopolymer. The 2-alkenylazlactone residual component, is easily functionalized with a variety of nucleophiles using either acid or base catalysts. The number average molecular weight of the resulting photopolymer, as determined by light scattering techniques, is in the range of about 2,000 to about 2,000,000 Daltons (preferably about 20,000 to about 1,000,000 Daltons).

Advantageously, the resulting photopolymer is preferably crosslinkable, non-tacky and easily processed, whereas certain commercial photo-oligomers are tacky and create processing difficulties. Another advantage is the relative oxygen insensitivity of the photopolymers. Although most commercial photo-oligomers are sensitive to the quenching effects of oxygen, the photopolymers used in the present invention are generally unaffected by oxygen and do not require the addition of an oxygen barrier coat, although the use of such an oxygen barrier coat is not outside the scope of the present invention.

The photopolymers are soluble in a variety of solvents including non-chlorinated solvents, such as MEK, and water-based solvents, such as water, and water miscible organic solvents. This allows coating of a photopolymer-containing formulation for a color proofing construction from a more environmentally acceptable solvent. The photopolymer is compatible with a wide range of polymers useful in the graphic arts and more particularly with those polymers typically used for pigment dispersions, such as vinyl acetate-vinyl alcohol copolymers. Another advantage of using the photopolymer in the present invention is improved shelf stability over certain commercially available photo-oligomers. For example, upon extended storage some photo-oligomers have been known to gel and have, at most, a three month shelf life, whereas the shelf life for the alkali soluble photopolymer of the present invention can be at least one year.

Referring to the following formula, particularly useful photopolymers are described, wherein $R^5$ and $R^6$ are as described above:

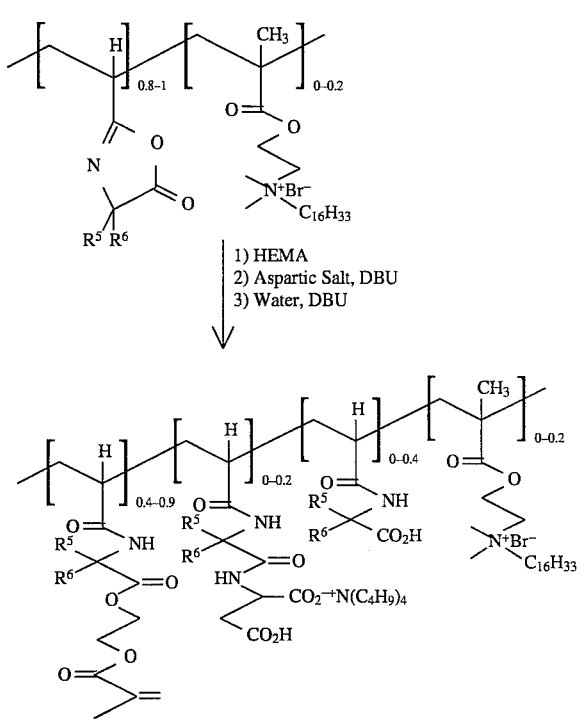

As shown in this scheme, the polymer can be functionalized using a base catalyst (diazabicycloundecane, DBU) and nucleophiles (2-hydroxyethylmethylacrylate, HEMA; aspartic acid mono-tetrabutyl ammonium salt; and water). These nucleophiles functionalize the polymer to provide polymerizability, compatibility, and solubility with other polymers and colorants, and developability of the photopolymer.

DONOR ELEMENT

The donor element consists of a substrate, preferably a flexible substrate, on which is coated a layer of thermally transferable material. The preferred flexible substrate is a polymeric film made of polyester (e.g., polyethylene terephthalate, PET), polyolefin, polyvinyl resin, polycarbonate, polyamide, polyimide, polyether sulfone, or cellulose ester. The substrate can be transparent or opaque, and about 2–100 μm thick, preferably about 3–10 μm thick, when a conventional thermal printhead is used for thermal transfer imaging. However, when a laser is used for the thermal transfer imaging, the substrate is preferably optically clear and thicker (20–100 microns).

(A) Mass Transfer Donor

Thermally transferrable materials suitable for making mass transfer donors are generally stable, nontacky, easily processed, and capable of softening at appropriate elevated temperatures (Tg, glass transition temperature, preferably below about 100° C). When coated on a substrate, they form a generally uniform layer with sufficiently low cohesive strength to allow high resolution image transfer to the receptor. The photopolymers of this invention possess these properties and are particularly suited to the production of mass transfer donors for making generally dry printing plates from digital data. Exemplary photopolymers suitable for use in this invention include homopolymers of VDM (2-vinyl-4,4-dimethyl-2-oxazoline-5one) functionalized with HEMA (hydroxyethyl methacrylate), and ASATBA (aspartic acid monotetrabutylammonium salt), copolymer of 95:5 wt. % VDM/DMAEMA-$C_{16}$ (2-methyacryloxyethyl-1-hexadecyldimethylammonium bromide) functionalized with HEMA and others such as ASATBA, LA (lactic acid), or TA (tropic acid), and copolymers of 95:5 wt. % VDM/DMAEMA (2-dimethylaminoethylmethacrylate) and 95:5 wt. % VDM/EOA (ethylene oxide acrylate, mean Mw=750) with various functional groups as mentioned above. The preparation of such polymers are described in U.S. Pat. No. 5,235,015 in Examples 1–15, and in U.S. Ser. No. 07/931,070 filed Aug. 17, 1992, the description of which is incorporated herein by reference. These polymers have a Tg of about 50° C. and are nontacky when coated on a polyester film base.

The above photopolymers are used in conjunction with a photoinitiator in the thermal transfer layer on the donor, so that they may be preferably crosslinked after imaging by exposing to radiation. The photoinitiator may be either a single compound which generates radicals on exposure to radiation or a combination of two or more components. Initiation may be direct or sensitized. Preferred photoinitiators are sensitized or unsensitized halomethyltriazines (described, for example, in U.S. Pat. Nos. 3,617,288 and 5,298,361) and sensitized diaryliodonium salts (described, for example, in U.S. Pat. Nos. 3,729,313; 4,058,400; 4,058,401; and 4,921,827). The photoinitiator is used at a concentration of about 0.01–10 percent by weight of the photopolymers.

Examples of diaryliodonium salts useful as photoinitiators in the practice of the instant invention may be generally described by the formulas given in U.S. Pat. No. 4,460,677. Examples of preferred diaryliodonium cations useful in the practice of the instant invention are diphenyliodonium, di(4-chlorophenyl)iodonium, 4-trifluoromethylphenylphenyliodonium, 4-ethylphenyliodonium, di(4-acetylphenyl)iodonium, tolylphenyliodonium, anisylphenyliodonium, 4-butoxyphenyliodonium, di(4-phenylphenyl)iodonium, di(carbomethoxyphenyl)iodonium, etc. Examples of other iodonium cations are disclosed in U.S. Pat. Nos. 3,729,313; 4,026,705; and 4,386,154.

Examples of substituted halomethyltriazines useful as photoinitiators in the practice of the instant invention are 2,4-bis(trichloromethyl)-6-methyl-s-triazine, 2,4,6-tris-(trichloromethyl)-s-triazine, and styryl substituted triazines such as 2,4-bis(trichloromethyl)-6-(4'-methoxystyryl)-s-triazine,2,4-bis(trichloromethyl)-6-(p-dimethylaminostyryl)-s-triazine, 2,4-bis(trichloromethyl)-6-(2',4'-diethoxystyryl)-s-triazine, 2,4-bis(trichloromethyl)-6-[4-(2-hydroxyethoxy)styryl]-1,3,5-triazine, etc. These compounds are described as noted above in U.S. Pat. Nos. 3,779,778; 4,386,154; 3,954,475; 5,298,361; and 3,987,037.

Some photoinitiators require the use of a sensitizer, i.e., photosensitizer, in an amount of about 0.5–10 wt. % of the total coating weight. Suitable sensitizers for the preferred photoinitiators are described in the foregoing references. For example, sensitizers for diphenyliodonium photoinitiators include any compound capable of sensitizing a photolyzable organic halogen compound, such as 2-methyl-4,6-bis-(trichloromethyl)-s-triazine. Such compounds will promote free radical formation when used in intimate admixture with diphenyliodonium photoinitiators. Since each sensitizer tends to have its own characteristic response in the visible and ultraviolet light spectrum, they may be used in combination to broaden the light response and/or increase the speed. Illustrative sensitizing dyes are those in the following categories: diphenylmethane, xanthane, acridine, roethine and polymethine, thiazole, thiazine, azine, aminoketone, porphyrin, colored aromatic polycyclic hydrocarbons, p-substituted aminostyryl compounds and aminotriaryl methanes.

The sensitivity of halomethyl-1,3,5-triazines to radiation of a particular range of wavelengths can be increased by the incorporation of known ultraviolet and visible light sensitizers including cyanine, carbocyanine, merocyanine, styryl, acridine, polycyclic aromatic hydrocarbons, polyarylamines and aminosubstituted chalcones. Cyanine dyes are described in U.S. Pat. No. 3,495,987. Styryl dyes and polyarylamines are described in Kosar, *Light Sensitive Systems*; J. Wiley and Sons: New York, NY; 1965; pp. 361–369. Polycyclic aromatic hydrocarbons useful as sensitizers, an example of which is 2-ethyl-9,10-dimethoxyanthracene, are described in U.S. Pat. No. 3,640,718. Amino substituted chalcones useful as sensitizers are described in U.S. Pat. No. 3,617,288. Halomethyl-1,3,5-triazines are used in conjunction with dialkylamino aromatic carbonyl compounds; 2-(benzoylmethylene)-5-benzothiazolidene thiazol-4-yl compounds; and 3-keto-substituted coumarin compounds.

The layer of photopolymerizable material may contain colorants such as pigments and dyes. Any dye that is soluble in the coating solvent and does not adversely affect the light sensitivity of the layer of photopolymerizable material, inhibit the polymerization reaction, or migrate excessively into adjacent layers, is suitable. Pigments can be selected from the many types that axe commercially available for matching color specifications established by the color printing industry. Pigments are more preferred as colorants in photopolymerizable compositions, and more particularly, in photopolymerizable compositions used in color proofing applications. Pigments are preferred because they have a lower tendency than dyes to migrate between layers. The pigment or combinations of pigments can be dispersed by milling the pigment in the photopolymerizable composition. More preferably, the pigment is dispersed by milling the pigment in a dispersing resin or combination of resins and then added to the photopolymerizable composition. The particular type of dispersion resin and the pigment-to-resin ratio chosen will depend on the particular pigment, surface treatment of the pigment, dispersing solvent, milling process, and the quality of dispersion required.

In addition to photoinitiators, sensitizers, and colorants, the photopolymers may be combined with other materials when coated on the donor as a thermally imageable layer, i.e., thermal transfer layer. For example, plasticizers, surfactants, antioxidants (e.g., ascorbic acid, hindered phenols, phenidone, etc.) in amounts sufficient to prevent premature crosslinking but insufficient to prevent crosslinking of the photopolymers upon addition of energy, antistatic agents, waxes, UV absorbers, mild oxidizing agents, and brighteners may be used without adversely affecting the practice of the invention. These additives can be added in amounts in the range of about 0.01–8% by weight of the photopolymers. Furthermore, a thermoplastic binder may optionally be present in the donor layer. Examples of suitable thermoplastic binders are sulfonated polyesters, polymethyl methacrylate, polyvinyl acetate, and the like. The binder may be used in an amount of up to about 35% by weight, preferably about 2–20% by weight of the photopolymers.

The photopolymer compositions of the present invention are coated by methods known in the art (e.g., solvent casting, knife coating, slot coating, curtain coating, etc.). The coating weight of the thermal transfer layer is typically about 0.2–4.0 g/m$^2$, preferably about 0.5–2.0 g/m$^2$.

(B) Thermal Photoinitiator/Sensitizer Transfer Donor

In another embodiment of this invention, the photoinitiator is separated from the photopolymer coating. The photoinitiator in a suitable binder is coated on the donor and the photopolymer is coated on the receptor. In yet another embodiment of this invention, the sensitizer in a suitable binder is coated on the donor and the photopolymer is coated on the receptor. If the photoinitiator is on the donor sheet, any required sensitizer can be either mixed with it on the donor sheet or coated on the receptor sheet. Alternatively, if a sensitizer is on the donor sheet, the photoinitiator can be either mixed with it on the donor sheet or coated on the receptor sheet.

The binder in the thermal photoinitiator/sensitizer transfer donor comprises polymeric resins or waxes with glass transition temperatures (e.g., about 20°–160° C.) such that they are capable of allowing the photoinitiator and/or sensitizer (i.e., photosensitizer) to diffuse (e.g., sublime or vaporize) from the donor layer to the receptor, leaving the binder on the donor sheet. Examples of such binders include, but are not limited to, vinyl chloride/vinyl acetate copolymers, polyesters, polycarbonates, cellulose, nitrocellulose, polyvinyl chloride, polyimide, cellulose acetate propionate, and polyvinyl butyral resins and mixtures thereof.

The photoinitiator and/or sensitizer transfer layer can include additives to help release the photoinitiator and/or sensitizer as well as to prevent the binder resins from sticking to the receptor. These include plasticizers, surfactants, fluorocarbons, silicones, UV stabilizers, elastomers, etc. The additives can be added in amounts of about 0.05–20% by weight of the total coating weight.

Both the thermal mass transfer donor sheets and thermal photoinitiator/sensitizer transfer donor sheets can include an antistick layer, i.e., a layer of a heat-resistant slippery material that prevents the donor sheet from sticking to the thermal printhead. The antistick layer is coated on the backside of the donor substrate. Suitable antistick slippery materials include silicones, higher fatty acids, fluorocarbons, surfactants, polysiloxanes, etc. Examples of materials used in antistick layers are disclosed in U.S. Pat. No. 5,141,915.

The donors may also include a near infrared light absorber when they are to be imaged with a diode laser or YAG laser. Light absorbers are used to convert light energy to heat, which is the most important driving force in thermal imaging. Suitable light absorbers include carbon black, pigments, graphite, dyes such as azo dyes (such as Cyasorb IR-165 light absorber from American Cyanamid, Wayne, N.J.), phthalocyanine dyes, etc. They can be incorporated in the donor substrate, donor transfer layer or an intermediate layer.

RECEPTOR OR PLATE ELEMENT

The present invention provides a printing plate base that is receptive to the hydrophobic polymer. In general, traditional printing plate bases, such as aluminum or even other metals such as steel, can be used as a substrate for the receptor, i.e., image receiving element. However, because metal plates are good heat conductors, they typically cause undesired heat loss during thermal imaging. Thus, although they can be used in the image receiving elements of the present invention, particularly when a more durable element is desired, they are not preferred. Advantageously, the image receiving element includes a polymeric substrate. Whatever the material is of the image receiving element, i.e., the printing plate base, advantage is realized by modifying its surface to a hydrophilic microporous surface, the construction of which is particularly useful as a receptor. The preferred polymeric base has good thermal insulating properties and is more flexible and easier to feed through a thermal printer. Alternatively, a thin substrate (e.g., thin polymer layer) having a hydrophilic microporous surface can receive a transferred image and the substrate with the image laminated to any appropriate surface.

The hydrophilic surface is a crosslinked silicated surface made of silica particles that adhere well to the substrate, particularly a polymeric substrate. The silicated surface is coated uniformly on the polymer film and is microporous, i.e., having submicron porosity. The submicron porosity is formed by a three-dimensional network consisting of millimicron size $SiO_2$ particles preferably coupled with the silicon of the silane coupling compound. The dimensions of the $SiO_2$ particles and the pores are smaller than the wavelength of visible light, resulting in an optically clear coating. The microporous surface is exceptionally receptive to the hydrophobic photopolymer. Furthermore, adhesion of the photopolymer to the microporous plate surface is excellent. Additionally, the microstructure helps improve the resolution of the image transferred. As a result, the printing plate made from this process using these materials is more useful and durable than those known in the art.

Thus, the preferred image receptor, i.e., image receiving element, of the present invention comprises a flexible substrate on which is coated a layer of a microporous hydrophilic crosslinked silicated material. The preferred substrates of this invention include any material having at least one polymeric surface which is to be used as the printing surface. Polymeric sheets made of polyester (e.g., polyethylene terephthalate or "PET" and polyethylenenaphthalate), polyimide, and fiberglass-reinforced polymeric composite are preferred at least because they have good thermal insulating properties and cause less undesired heat loss through the sheet during thermal imaging. The substrate can be transparent or opaque, and about 50–500 μm thick, preferably about 100–250 μm thick. It can be thinner if it is to be laminated to another substrate.

The polymeric surface may be optionally coated with a primer to further increase compatibility with the hydrophilic coating. Useful primed polymer substrates include, but are not limited to, gelatin-primed polyethylene terephthalate and polyvinylidene chloride copolymer on polyester. Other primers such as aziridines, acrylates, and melamine-formaldehyde resins are also known. The coating weight of the primer ranges from about 0.05–5 g/m², preferably about 0.1–2 g/m². Nonchemical adhesion promoting treatments can also be used, including but not limited to, corona discharge, flame treatment, laser ablation, quasi-amorphization, etc.

The hydrophilic surface is made of silica particles, preferably of less than about 500 nm, crosslinked by a coupling agent and adhered strongly to the polymeric substrate. The preferred microporous crosslinked silicated surface is prepared by coating an aqueous solution containing a colloidal silica sol and an ambifunctional silane coupling agent on the polymeric surface of the substrate sheet, which is to be used as the printing plate. The colloidal silicas are different from silica powders in that they are discrete, non-agglomerated and uniformly dispersed in a liquid medium. The surface of the colloidal particle has silanol groups which are partially ionized. The partially ionized particle is stabilized by a counter ion in a dispersion. Suitable silica sols include sodium, potassium, and ammonium stabilized colloidal silica dispersions, such as NALCO 2326 commercially available from Nalco Chemical. Chicago, Ill. Preferred mean particle size is about 2–100 nm. and more preferably about 4–50 nm.

Suitable coupling agents are compounds with at least two different reactive groups, each group being capable of reacting with another species. Such materials include ambifunctional titanales and silanes, for example, particularly ambifunctional silanes which have reactive silanes on one end of the molecule and a different species capable of chemical bonding with the substrate or a coated primer on the substrate. The ambifunctional silanes can be represented by the following formula:

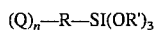

$$(Q)_n\text{—}R\text{—}Si(OR')_3$$

where R' is alkyl or aryl; R is an organic group with (n+1) external bonds or valences; n is 0, 1, or 2; and Q is a moiety capable of bonding with the substrate or a coated primer on the substrate. The silane reacts with silanol groups of the colloidal silica particles and forms a crosslinked network when dried at elevated temperature.

Preferably R' is alkyl group having 1 to 10 carbon atoms, and more preferably 1 to 4 carbon atoms. R is preferably an aliphatic or aromatic bridging group such as alkylene, arylene, or alkarylene which may be interrupted with ether linkages, nitrogen linkages, or other relatively inert moieties. Preferably R is an alkylene group having 1 to 12 carbon atoms, more preferably 2 to 6 carbon atoms, with n is equal to 1. Q is preferably epoxy (e.g., glycidyl), or amino, either primary or secondary, more preferably primary amino.

The ratio of the colloidal silica to the coupler in the coating solution is generally from 15:1 to 4:1 by weight, depending on which silica and coupler are used. For example, when NALCO 2326 colloidal silica with a mean particle size of 5 nm and pH of 9.0 is to be crosslinked with 3-aminopropyl triethoxysilane, the useful ratio is between 12.5: 1 to 5:1 by weight. The coating solutions can include other materials such as coating aids, surfactants, binders, etc., in amounts sufficient to improve coating quality yet not adversely affect the desired hydrophilicity. These additives can be added in amounts in the range of about 0.01–5% by weight of the colloidal silica. The resulting solutions are coated by methods known in the art and dried, for example, at 100°–120° C. to yield a dry coating weight of about 0.1–2 g/m², preferably about 0.3–1.2 g/m².

The basic technology of crosslinking colloidal silicas by a silane coupling agent to form a primed surface for adhesive coating and photographic film applications has been disclosed in U.S. Pat. No. 5,204,2 19, which is incorporated herein by reference. In the present invention, the technology is further advanced, thus allowing it for new applications in making direct lithographic printing plate from thermal transfer imaging. In lithographic printing plate applications, the plate surface should preferably have excellent water wettability. Using a dynamic Wilhemy balance (Cahn Instruments, DCA Model 322), the weltability of the surface prepared by this invention is dependent upon its surface structure as well as its surface energy. Both of the two preferred starting materials, colloidal silica and silane coupler, contribute to the resulting surface energy and structure. The film made by the same method but without using the preferred silane coupler or with the coupler but in an excess amount (e.g., silica to silane ratio less than 4) generally has poor wettability. The film made using silane coupler alone also generally has poor wettability, i.e., with a contact angle greater than about 35°. However, the film made with proper ratio of silica to silane produces highly microporous surface and excellent water wettability with a contact angle of about 15°, thus making it suitable for printing plate applications. Thus, a coupling agent is chosen and used in an amount that produces a surface with good wettability, i.e., that has a contact angle of no greater than about 35°.

(A) Mass Transfer Receptor

The microporous crosslinked silicated surface of the printing plate of this invention is an excellent thermal mass transfer receptor. During thermal transfer imaging, the microporous surface, through intimate contact and capillary action, effectively receives the melted or softened photopolymer images from the mass transfer donor. The transferred photopolymer images are then preferably crosslinked by exposing to a UV light. Suitable light sources include mercury, xenon, carbon arc and tungsten filament lamps, lasers, sunlight, light emitting diodes, etc. Exposures may be from less than about a microsecond to 15 minutes depending upon the amounts of polymerizable materials, the photoinitiator utilized, the radiation source, and the distance from the source.

(B) Thermal Photoinitiator/Sensitizer Transfer Receptor

The thermal photoinitiator/sensitizer transfer receptor sheet is prepared by coating the silicated printing plate of this invention with the photopolymers as described earlier in this invention. The desired coating weight is about 0.2–4 g/m$^2$, preferably about 0.5–2.0 g/m$^2$. The plate, after imaging, is preferably exposed to a UV light, and then developed by a conventional method. The photopolymer layer can also include a photoinitiator, photosensitizer, and/or colorant, as discussed above depending on whether the photoinitiator or sensitizer is on the donor element.

EXAMPLES

Example 1: Preparation of Printing Plate Base

A modified silica sol solution containing 1.25 wt. % colloidal silica (NALCO 2326 ammonium stabilized colloidal silicas with mean particle size 5 nm from Nalco Chemical, Chicago, Ill.), 0.113 wt. % of 3-aminopropyl triethoxysilane, and 0.03 wt. % octylphenoxy ethanol (TX-100 from Rohm & Haas, Philadelphia, Pa.) was coated on a 4-mil PVDC (polyvinylidene chloride) primed (SCOTCHPAR polyester film from Minnesota Mining and Manufacturing Company (St. Paul, Minn.) with a #12 Meyer bar and dried in an oven at 118° C. for about 3 minutes. This resulted in a highly crosslinked silicone surface with submicron thickness. The coating adhered to the substrate so well that it could not be peeled off by a SCOTCH Magic Mending Tape #81 (Minnesota Mining and Manufacturing Company, St. Paul, Minn.). Instead of the coating being peeled off, a bond resulted which pulled the adhesive layer from the adhesive backing of the tape. The resulting film was tested for wettability by observing the rate of spreading water droplets on the film. Its wettability was further tested by using a dynamic Wilhelmy balance (Cahn Instruments, DCA Model 322). The spreading rate of water droplets on this film was extremely high. A water droplet, once dropped to the film, spread to double its size within two seconds, indicating the presence of high surface porosity. The contact angle of water on the film surface was 17°, indicating excellent wettability.

Example 2: Preparation of Thermal Mass Transfer Donor

A functionalized copolymer of VDM (2-vinyl-4,4-dimethyl-2-oxazoline-5-one) was prepared as described in Example 4 of U.S. Pat. No. 5,235,015, which is incorporated herein by reference. Briefly, a 95:5 wt. % copolymer of VDM and (2-methacryloxyethyl)-1-hexadecyldimethylammonium bromide (DMAEMA-C$_{16}$) was functionalized by reacting with 2-hydroxyethyl-methacrylate (HEMA, 0.7 equivalents), aspartic acid monotetrabutylammonium salt (ASATBA, 0.1 equivalent) and water (0.2 equivalents), all equivalents with respect to VDM. An MEK solution containing 2 grams of 10% by weight of the VDM copolymer, 0.01 g para-MOSTOL initiator (2,4-bis(trichloromethyl)-6-[4-(2-hydroxyethoxy)styryl] -1,3,5-triazine, U.S. Pat. No. 5,298,361), and 0.008 g of HSR-31 (tricyano magenta dye from Mitsubishi Chemical, Tokyo, Japan) was coated on a 6 micron polyester film with a #16 Meyer bar and dried at room temperature. The resulting coating was smooth and non-sticky.

Example 3: Digital Mass Transfer Printing Plate Process

The above donor ribbon prepared in Example 2 was laid on the silicated PET plate from Example 1 and was fed through an experimental thermal transfer printer (Minnesota Mining and Manufacturing Company, St. Paul, Minn.) and imaged at various voltages. A clear sharp image was mass-transferred from the donor sheet to the PET plate at 12 to 15 volts. The adhesion of the resultant image to the plate appeared to be good. It was then exposed to UV light in a Berkey Ascor unit for 20 seconds. The resulting image was tough and could not be removed by the SCOTCH Magic Mending Tape, described in Example 1. The resulting plate was evaluated for inkability. The ink test was successful. Only the imaged areas absorbed ink, and the hydrophilic background remained free of ink.

Example 4: Preparation of Thermal Photoinitiator Transfer Receptor

A solution consisting of 15 wt. % of the VDM copolymer of Example 2 and 0.1% of HSR-31 dye in methyl ethyl ketone was coated on the silicated PET (Example 1) with a #16 Meyer bar and dried in room air.

Example 5: Preparation of Thermal Photoinitiator Transfer Donor Ribbon

Photoinitiator (Para-MOSTOL, 0.05 g) was dissolved in 1.1 g of a 5 wt. % solution of BUTVAR B-76 (polyvinyl butyral resin from Monsanto Chemical Company, St. Louis, Mo.) in tetrahydrofuran. This solution was mixed with 0.008 g of FC-431 (a fluorocarbons surfactant from Minnesota Mining and Manufacturing Company, St. Paul, Minn.) and was coated onto a 6-micron PET film with a #8 Meyer bar. The resultant coating was smooth and nonsticky.

Example 6: Digital Thermal Photoinitiator Transfer Printing Plate Process

The donor ribbon prepared in Example 5 was laid on the receptor sheet from Example 4 and was fed through an experimental thermal transfer printer (Minnesota Mining and Manufacturing Company, St. Paul, Minn.) and imaged at 14 to 16 volts. After transfer, the donor was peeled off without mass transferring. The resultant receptor was then exposed to UV light in a Betkey Ascot unit for 30 seconds, and then washed with 0.1N aqueous sodium bicarbonate (pH 8.4). In the non-imaged areas, the polymer was washed off easily. In the imaged areas, the polymer apparently became crosslinked and could not be washed away, resulting in a clear sharp image. The resulting image was tough and could not be removed by a SCOTCH Magic Mending Tape, described in Example 1. The resulting plate was evaluated for inkability. The ink test was successful. Only the imaged areas absorbed ink, and the hydrophilic background remained free of ink.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. An image receiving element comprising a substrate having a photopolymer layer on at least one major surface thereof, said substrate having a microporous hydrophilic crosslinked silicated surface comprising a colloidal silica crosslinked by a coupling agent, said photopolymer layer comprising photopolymer described by the following formula:

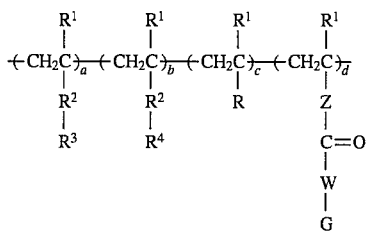

wherein:

$R^1$ independently is hydrogen or methyl;

$R^2$ is represented by

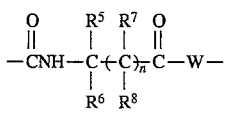

wherein:

n is 0 or 1; and $R^5$, $R^6$, $R^7$, and $R^8$ are each independently an alkyl group having 1 to 12 carbon atoms or a cycloalkyl group having 5 to 12 carbon atoms, an aryl or aralkyl group having 6 to 12 carbon atoms, or at least one of the pairs $R^5$ and $R^6$, or $R^7$ and $R^8$, taken together with the carbon to which it is joined forms a 5- or 6-membered carbocyclicy ring, or any of $R^5$, $R^6$, $R^7$, and $R^8$ may be H;

W is —NH—, —$NR^{20}$, —S—, or —O—, wherein $R^{2°}$ is an alkyl group having 1 to 12 carbon atoms; and Z is represented by

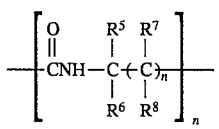

wherein $R^5$, $R^6$, $R^7$, $R^8$, and n are as previously described;

$R^3$ is a polymerizable, ethylenically unsaturated group selected from

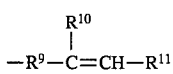

wherein:

$R^9$ is an alkylene group having 1 to 12 carbon atoms, an arylene group having 6 to 10 carbon atoms, an oxyalkylene group or a poly(oxyalkylene) in which said alkylene group has 2 to 4 carbon atoms and the number of oxygen atoms is a positive integer less than or equal to four;

$R^{10}$ is hydrogen, cyano, a carboxyl group, or a —C(=O)NH$_2$ group; and $R^{11}$ is hydrogen, an alkyl group having 1 to 12 carbon atoms, or a phenyl group or naphthyl group; or (ii) —$R^9$—W—T;

wherein:

$R^9$ is as defined in (i);

W is as previously defined; and

T is an ethylenically unsaturated group selected from the group consisting of allyl, vinyl, acryloyl, methacryloyl, cinnamoyl, maleoyl, fumaroyl, itaconoyl, and crotonoyl;

a, b, c, and d are independently integers, wherein a and b are at least 1, and the sum of a+b+c+d is sufficient to provide a polymer having a number average molecular weight in the range of 2,000 to 2,000,000 Daltons;

G is represented by —$R^9$—$N^+R^{12}R^{13}R^{14}X^-$;

wherein:

$R^9$ is as previously defined; and $R^{12}$–$R^{14}$ are each independently an alkyl group having 1 to 24 carbon atoms or a cycloalkyl group having 5 to 12 carbon atoms, an aryl or aralkyl group having 6 to 12 carbon atoms, or any two or all three of $R^{12}$–$R^{14}$ taken together with the nitrogen to which they are joined form a 5- to 8-membered heterocyclic ring; and $X^-$ represents any non-interfering anion;

R represents an aryl group having 6 to 30 carbon atoms, cyano, —$CO^2H$, carboalkoxy group having 2 to 40 carbon atoms, or a mono- or dialkylcarbamoyl group having 2 to 40 carbon atoms; and $R^4$ represents hydrogen, a solubilizing cation, or —E—A;

wherein:

E represents an organic divalent connecting group having up to a total of about 18 C, N, S, and nonperoxidic O atoms; and A is an organic or inorganic acid or salt thereof.

2. The image receiving element of claim 1 wherein said coupling agent is selected from the group consisting of ambifunctional titanates and silanes.

3. The image receiving element of claim 1 wherein said coupling agent is represented by the following formula:

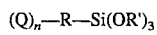

where R' is alkyl or aryl; R is an organic group with (n+1) external bonds or valences; n is 0, 1, or 2; and Q is a moiety capable of bonding with said substrate.

4. The Image receiving element of claim 3 wherein Q is capable of bonding with a coated primer on said substrate.

5. The image receiving element of claim 3 wherein Q comprises an epoxy or primary amino group.

6. The image receiving element of claim 3 wherein R' is an alkyl group having 1 to 10 carbons atoms.

7. The image receiving element of claim 3 wherein R is an alkylene group having 1 to 12 carbon atoms.

8. The image receiving element of claim 3 wherein R is an alkylene group having 2 to 6 carbon atoms.

9. The image receiving element of claim 1 wherein said collodial silica comprises silica particles having a mean particle size between 2 and 100 nanometers.

10. The image receiving element of claim 1 wherein said collodial silica comprises silica particles having a mean particle size between 4 and 50 nanometers.

11. The image receiving element of claim 1 wherein the ratio of said collodial silica to said coupling agent is between 15:1 and 4:1 by weight.

12. The image receiving element of claim 1 wherein said microporous hydrophilic crosslinked silicated surface is present at a coating weight between 0.1 and 2 g/m$^2$.

13. The image receiving element of claim 1 wherein said microporous hydrophilic crosslinked silicated surface is present at a coating weight between 0.3 and 1.2 g/m$^2$.

14. The image receiving element of claim 1 wherein said photopolymer layer further comprises a sensitizer.

15. The image receiving element of claim 1 wherein said photopolymer layer is present at a coating weight between 0.2 and 4 g/m$^2$.

16. The image receiving element of claim 1 wherein said photopolymer layer is present at a coating weight between 0.5 and 2.0 g/m$^2$.

* * * * *